United States Patent [19]

Gander et al.

[11] 4,297,533

[45] Oct. 27, 1981

[54] DETECTOR TO DETERMINE THE PRESENCE OF AN ELECTRICAL SIGNAL IN THE PRESENCE OF NOISE OF PREDETERMINED CHARACTERISTICS

[75] Inventors: Jean-Gabriel Gander, Recherswil; Ralph Aubert, Zug, both of Switzerland

[73] Assignee: LGZ Landis & Gyr Zug AG, Zug, Switzerland

[21] Appl. No.: 46,508

[22] Filed: Jun. 7, 1979

[30] Foreign Application Priority Data

Aug. 31, 1978 [CH] Switzerland .................. 9196/78

[51] Int. Cl.$^3$ .................. H04M 1/50; H04B 1/06; H04K 5/20
[52] U.S. Cl. .................. 179/84 VF; 179/1 D; 179/1 P; 179/15 D
[58] Field of Search .................. 179/1 D, 1 P, 1 SD, 179/84 VF, 1 SA, 1 SC; 324/78 D

[56] References Cited

U.S. PATENT DOCUMENTS

| | | | |
|---|---|---|---|
| 3,588,363 | 6/1971 | Herscher et al. | |
| 3,937,899 | 2/1976 | Denenberg | 179/84 VF |
| 3,944,753 | 3/1976 | Proctor et al. | 179/1 P |
| 3,946,157 | 3/1976 | Dreyfus | 179/1 SA |
| 3,990,006 | 11/1976 | Zebo et al. | 324/78 D |
| 4,009,353 | 2/1977 | James et al. | 179/84 VF |
| 4,057,690 | 11/1977 | Vagliani et al. | |
| 4,063,031 | 12/1977 | Grunza | 179/1 SD |
| 4,119,808 | 10/1978 | Atkin | 179/84 VF |

FOREIGN PATENT DOCUMENTS

| | | |
|---|---|---|
| 2623025 | 1/1977 | Fed. Rep. of Germany . |
| 2555248 | 6/1977 | Fed. Rep. of Germany . |
| 1221179 | 2/1971 | United Kingdom . |
| 1255834 | 12/1971 | United Kingdom . |

*Primary Examiner*—Thomas A. Robinson
*Attorney, Agent, or Firm*—Ernest F. Marmonek

[57] ABSTRACT

A detector for determining the presence of an electrical signal in the presence of noise, the electrical signal having at least two predetermined characteristics, includes a signal transforming device for obtaining a plurality of independent estimates of each characteristic, a classification device connected to the signal transforming device for sorting the plurality of independent estimates into at least two classes, and a counting device for signaling the presence of the electrical signal, when the number of the estimates within one class exceeds a predetermined number.

16 Claims, 11 Drawing Figures

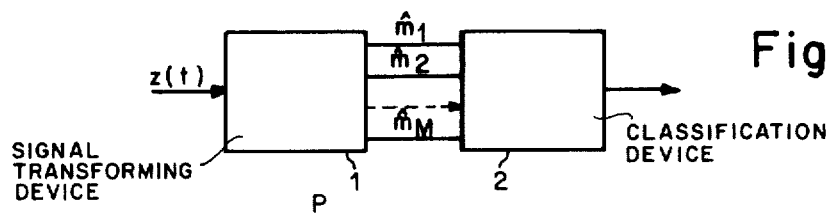
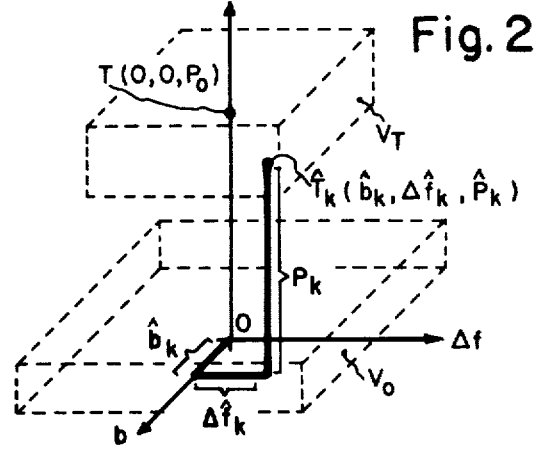
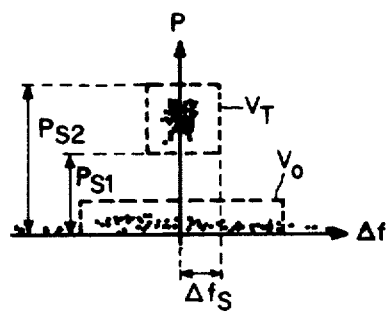
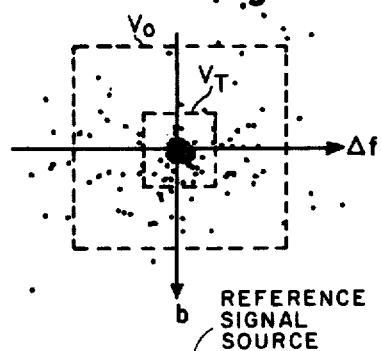
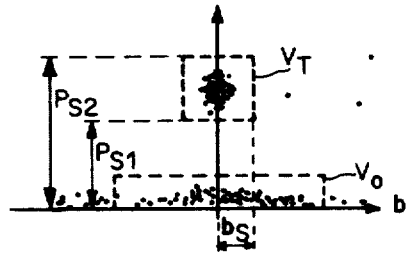
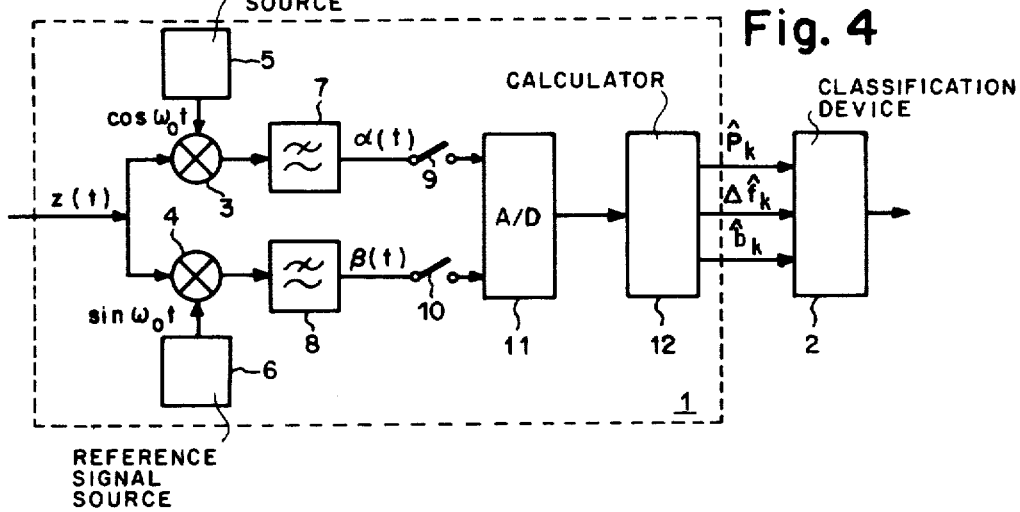

DETECTOR TO DETERMINE THE PRESENCE OF AN ELECTRICAL SIGNAL IN THE PRESENCE OF NOISE OF PREDETERMINED CHARACTERISTICS

BACKGROUND OF THE INVENTION

The invention relates to the detection of a tone signal with predetermined characteristics in the presence of a high degree of noise.

Methods for the extraction of weak signals in the presence of noise have been developed in the space age, particularly for detecting weak signals transmitted to earth from space probes situated at planetary distances from the earth. These methods have made extensive use of pseudo-random sequences; the noise dealt with has, however, almost exclusively been "white noise"; "DATA TRANSMISSION" by William R. Bennet, and James R. Davey (McGraw-Hill Book Co., 1965), provides a good analysis of such transmission methods.

Treatment of digital space communications, plus coverage of underlying theoretical concepts, including material on pseudo-random codes can be obtained from "Digital Communications with Space Applications", Solomon W. Golomb et al. (Prentice-Hall series, 1964).

In addition to proposals for methods and apparatus for extracting a weak signal in the presence of noise, various proposals have been made for detecting the presence of a speech signal in a voice channel. For example, U.S. Pat. No. 4,057,690, dated Nov. 8, 1977, provides an active channel indication when the presence of a speech signal is detected in the voice channel; an idle channel indication is obtained when the absence of the speech signal is detected in the same voice channel.

German Offenlegungsschrift No. 26 23 025, published Jan. 27, 1977, deals with a method and an apparatus for analysis of a speech signal, including multi-channel signals, in which an estimated value is compared to another predetermined signal value, the signal itself being compared to a second constant prearranged threshold value, these various values being further processed so that a logical signal is obtained which corresponds to the presence or absence of a voice signal in a speech channel.

There is also known a ripple control receiver for use in a ripple control system, wherein signals are superimposed on an electrical power distribution, for example, for control purposes. Cf. British Pat. No. 1,221,179, published Feb.3, 1971. In that British patent, there is provided a ripple control receiver, including an input circuit including a frequency filter, an amplifier and a receiving relay having operating means operable by direct current. The output of the filter is connected directly to the control input of the amplifier, which has a response threshold, and is blocked in the rest condition of the ripple control receiver. The operating means of the receiving relay are connected directly in the operating circuit of the amplifier, and the voltage transfer of the filter has substantially the same temperature coefficient as the response threshold of the amplifier.

There is also known a mechanism for automatic recognition and differentiation of complex information, particularly to determine the modulation-type of a high frequency signal. Cf. German Offenlegungsschrift No. 25 55 248, published June 16, 1977. This publication teaches a preliminary circuit in which the information is continuously subdivided into a plurality of basic criteria, a coding circuit which codes such criteria, and stores them in an intermediate memory, a control circuit which transfers the stored and coded criteria into a plurality of classification vectors, which in turn are stored at predetermined storage locations corresponding to respective classes of a second memory as a sample corresponding to the frequency of occurrence of classification vectors, which vectors are in turn fed to an M-ary shift register, in which the last classification vectors are stored and by means of which the "frequency of occurrence" histogram has been formed in the second memory. There is further provided, in that publication, a comparison circuit in which predetermined patterns are compared with the patterns stored in each memory, an output signal being obtained upon coincidence of reference values with those stored in the memory.

The publication, however, deals purely with the recognition of various predetermined waveforms and criteria, relating primarily to the frequency content of a received signal, without taking into account other important criteria of the signal. The publication, furthermore, in contrast to the instant invention, is not related to the extraction of a signal in the presence of noise, nor does it provide counting means for signaling the presence of an electrical signal, when a plurality of predetermined estimates in one of at least two classes exceeds a predetermined number.

There are also known detectors to determine the presence of a tone frequency signal, so-called tone detectors, which mostly use a band pass filter tuned to the expected tone frequency.

An evaluation circuit coupled to the band pass filter determines whether an envelope of the tone frequency signal at the output of the band pass filter is below or above a predetermined threshold, and correspondingly an output is obtained, which is either a "YES" or a "NO" signal, signifying the presence or absence of the tone signal.

Such tone detectors are frequently used in remote-controlled receivers of diverse types, which receivers are connected to a transmitter, either by a dedicated line or by radio. Such detectors operate satisfactorily, as long as any corrupting signals at their inputs consist of white or thermal noise only. A reliable YES/NO signal is not, however, insured, if corrupting impulse signals or interference signals of a small bandwidth are superimposed onto the tone frequency signal.

There are also known detectors for determining the presence of a direct current or direct voltage, which consist of an integrator and a threshold circuit. Such detectors serve for the reception of alarm signals in alarm circuits, where the alarm signals are transmitted by direct current. Any erroneous signal provided by such a detector due to interfering signals may have serious consequences.

SUMMARY OF THE INVENTION

It is the principal object of the present invention to devise a detector for determining the presence of an electrical signal having predetermined characteristics, which has a very high immunity with respect to interference signals, such as interference impulses and the like, and whose decision criteria can be tailored to the expected interference signal.

Specifically, it is another object of the present invention to obtain estimates of appropriate characteristic features according to the characteristics of the detecting signal, and the expected interference signals, to separate those characteristic features into several classes, and in dependence of the number of the estimated values falling within these individual classes, to obtain a reliable YES/NO decision, as to the presence or absence of the electrical signal. By setting appropriate limits in the individual classes, it is possible to tailor the decision criteria to the expected interference signals.

Further objects and advantages of the invention will be set forth in part in the following specification and in part will be obvious therefrom without being specifically referred to, the same being realized and attained as pointed out in the claims hereof.

These objects are attained in accordance with one embodiment of the invention, by providing a detector for determining the presence of an electrical signal in the presence of noise, the electrical signal having at least two predetermined characteristics. The detector includes a signal transforming means for obtaining a plurality of independent estimates of each of the characteristics, classification means connected to the signal transforming means for sorting the plurality of independent estimates into at least two classes, respectively, and counting means for signaling the presence of the electrical signal when the number of the estimates within one of the classes exceeds a predetermined number.

In one version of the invention, the electrical signal includes a tone signal, the predetermined characteristics include the three characteristic features of output level, frequency, and bandwidth of the tone signal, and the signal transforming means obtains at least two of the three characteristic features of the predetermined characteristics.

In accordance with another feature of the invention, the electrical signal preferably includes an input signal having a D.C. component, the predetermined characteristics include the three characteristic features of output level, bandwidth and time derivative of the input signal, and the classification means sorts the plurality of independent estimates of at least two of the three characteristic features into the at least two classes.

It is advantageous if the detector includes a microprocessor, the microprocessor then forming at least a portion of the signal transforming means, and of the classification means.

When the tone signal includes a tone frequency having a complex envelope Z(t), and when Ż(t) is the time derivative of the complex envelope, it is advantageous if the signal transforming means obtains the frequency from the imaginary portion of the quotient of the time derivative of the complex envelope divided by the complex envelope $$\left[ Im \frac{\dot{Z}(t)}{Z(t)} \right].$$

and obtains the bandwidth from the real portion of the quotient of the time derivative of the complex envelope divided by the complex envelope $$\left[ Re \frac{\dot{Z}(t)}{Z(t)} \right].$$

It is advantageous if the signal transforming means includes a first multiplier means for forming a product of the frequency of the tone signal z(t), and a first sinu-soidal reference frequency (Cos $\omega_o t$), and a second multiplier means for forming a product of the frequency of the tone signal z(t) and a second sinusoidal reference frequency (sin $\omega_o t$) shifted by 90° with respect to the first sinusoidal reference frequency, and if additionally, postcoupled to each multiplier, means are provided for de-emphasizing high frequencies in the output of each multiplier, respectively.

In one version of the invention, the means postcoupled to each multiplier means include a low-pass frequency filter; in another version of the invention, the means postcoupled to each multiplier include an integrator.

It is advantageous if the multipliers are digital multiplier means, and if additionally digital signal generating means are provided for generating the reference frequencies.

In one version of the invention, the classification means sorts the plurality of estimates into at least two classes corresponding to different respective signal characteristics, so that when the number of estimates within a respective class exceeds a predetermined number, the detector signals the presence of the signal corresponding to the respective class.

BRIEF DESCRIPTION OF THE DRAWINGS

For a fuller understanding of the nature and objects of the invention, reference should be had to the following detailed description, taken in connection with the accompanying drawings in which:

FIG. 1 is a block diagram of the detector;

FIG. 2 is a three-dimensional representation of three characteristic features of the signal;

FIGS. 3a, 3b, and 3c show, respectively, an elevational view, a plan view, and a side view of the estimated values;

FIG. 4 is a block diagram of the tone detector;

DESCRIPTION OF THE PREFERRED EMBODIMENTS

Figure 5:
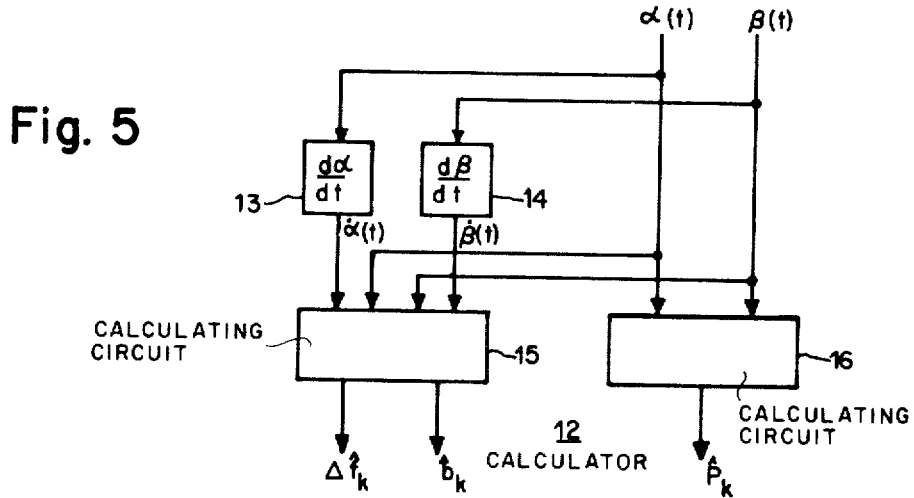
FIG. 5 is a circuit diagram of the calculator portion of the signal transforming device.

In carrying the invention into effect, in FIG. 1, there will be seen a signal transforming means or device 1 for obtaining a plurality of independent estimates of $M \leq 2$, of characteristic features of an electrical input signal z(t) to be detected. In the example illustrated, the estimated values $\hat{m}_1(t), \hat{m}_2(t), \ldots \hat{m}_M(t)$ of M characteristic features of the input signal z(t) are obtained; these estimated values represent vectors: $\hat{m}(t) = [\hat{m}_1(t), \hat{m}_2(t), \ldots \hat{m}_M(t)]$. If the input signal z(t) is interrogated or scanned by means of a scanning frequency $f_T$, then during an observation time D, a total of $n = D \cdot f_T$, characteristic features are obtained.

The n feature vectors are separated in a classification means or device 2, into at least two classes, where one determines whether the number of feature vectors within a predetermined class exceed a predetermined threshold value. In the affirmative, a "YES" signal is obtained at the output of the classification device 2, which shows the presence of an expected input signal z(t).

A "NO" decision may also be based on the number of feature vectors falling into a second class.

The number of the characteristic features depends on the type of the input signal z(t) to be detected, and on the type of the expected interference signals. This will be described with the aid of FIGS. 2 to 7, which show a detection of a tone frequency signal. The tone detection is preferably accomplished by means of the three characteristic features of:

Tone output level: $P_o$
Tone frequency: $f_o$
Tone bandwidth: $b_o$.

It is also possible to take into account additional features of a tone frequency signal, if these correspond to essential characteristics of the tone frequency signal, for example, its occurrence in time and/or its time duration.

In the ideal case, the tone frequency $f_o$ is known and constant, and the tone fluctuations $b_o$—also referred to as bandwidth—are zero. The signal transforming device forms successively n independent feature vectors $$\hat{m}_k = (\hat{P}_k, \hat{f}_k, \hat{b}_k), \hat{k} = 1 \ldots n$$

within the observation period D of these three features.

Each measurement k provides a tone estimating point $\hat{T}_k(\hat{b}_k, \hat{f}_k, \hat{P}_k)$ according to the feature vector $\hat{m}_k$.

As is shown in FIG. 2, the tone estimating points $\hat{T}_k$ can also be represented in a three-dimensional space having axes b, f, and P. In the representation according to FIG. 2, the point $f = f_o$ has been chosen as the origin O of the f axis. In the case where no interference signals are present, and the measurement is free of any errors, the tone estimate yields the point $T(O, O, P_o)$ on the P axis. A grouping of the tone estimated points $\hat{T}_k$ in the vicinity of the point T points to the presence of the expected tone frequency signal, and a grouping in the vicinity of the origin O is to be interpreted as the absence of the expected tone frequency signal.

The classification device 2 determines whether a grouping occurs in the vicinity of the point T, or the vicinity of the origin O, so that correspondingly a "YES" signal or a "NO" signal is obtained. A simple implementation example for the recognition of groups can be realized by means of the decision space $V_T$, which includes the point T. Here, one counts the number $k_T$ of the estimated tone points $\hat{T}_k$, falling within this decision space $V_T$.

If $k_T$ exceeds a predetermined threshold value $k_{ST}$, then this is interpreted as the presence of the expected tone frequency signal. If $k_T \leq k_{ST}$, then it can be concluded that the expected tone frequency signal is absent.

Additionally, a decision space $V_o$, including the origin O, may be preferably defined, and if the number $k_o$ of the estimated tone values $\hat{T}_k$, falling within the decision space, is greater than a predetermined threshold value $k_{So}$, then one can conclude that the expected tone frequency signal is absent. By this means it is possible to detect an error in the system, namely in the transmitter, in the transmission channel, or in the detector, if both $k_T$, as well as $k_o$ are too small.

Furthermore, the decision spaces $V_T$ and $V_o$ may, according to the peculiarities of the interference signals, occupy an arbitrary shape, for example, a spherical form. In the example illustrated, they form, however, a parallelepiped block, which has sides parallel to respective axes P, $\Delta f$ and b, which permits an independent classification of the estimated values $\hat{P}_k$, $\Delta \hat{f}_k$, and $\hat{b}_k$, and also a very simple realization.

In FIGS. 3a through 3c, there are shown measurement results for the case of the presence of a tone frequency signal and in the case of white noise. Each point represents an estimated tone value $\hat{T}_k$ in the planes P, $\Delta f$ (FIG. 3a), b, $\Delta f$ (FIG. 3b) and P, b (FIG. 3c). It is obvious that by the statistical evaluation described, a very reliable detection of the tone frequency signals is insured. Also, in the case of any impulse errors and interfering frequencies, an easily determinable grouping in the vicinity of the point T of FIG. 2 is realized. The limits of the classes determined by the decision space $V_T$, $V_o$, can be tailored to the respective occurrences, so that an optimal decision is possible for each interfering case.

In FIGS. 3a through 3c, there is shown, for example, a lower limit $P_{S1}$, as well as an upper limit $P_{S2}$ for the tone output, a limit $\Delta f_S$ for the tone frequency, and a limit $b_S$ for the tone fluctuations. From FIGS. 3a through 3c, one can also see that in relatively simple cases, it may be sufficient to evaluate only two of the three features (P, $\Delta f$, or f) and b.

To obtain the estimated values $\hat{P}_k$, $\hat{f}_k$, and $\hat{b}_k$ in the signal transforming means or device 1, various possibilities exist. In what follows a particularly advantageous implementation will be described.

For the tone frequency signal z(t) to be detected, the following applies:

$$z(t) = A(t) \cdot \cos(2\pi f t + \psi) \tag{1}$$

where A is the amplitude, t the time, f the frequency, and $\psi$ the phase angle. The tone frequency signal z(t) may be described by the complex envelope Z(t) of the input signal composed of the tone frequency signal and the interference signal. The tone frequency signal z(t) corresponds to the real portion of the complex signal $Z(t) \cdot e^{j\omega_o t}$:

$$z(t) = Re\{Z(t) \cdot e^{j\omega t}\} \tag{2}$$

where $\omega_o$ is $2\pi f_o$. For $\Delta\omega$ is equal to $2\pi (f - f_o)$, the complex envelope Z(t) is then given by:

$$Z(t) = A(t) \cdot e^{j\psi} \cdot e^{j\Delta\omega t} \tag{3}$$

If the value $\dot{\gamma}(t)$ is calculated to be:

$$\dot{\gamma}(t) = \frac{d[\ln Z(t)]}{dt} = \frac{\dot{Z}(t)}{Z(t)} \tag{4}$$

then it follows that:

$$\dot{\gamma}(t) = \frac{\dot{A}(t)}{A(t)} + j\Delta\omega \triangleq 2\pi b + 2\pi j \Delta f \tag{5}$$

The tone fluctuation b may be determined from the real position Re of the value $\dot{\gamma}$, the tone frequency deviation $\Delta f$ from the imaginary portion of the value $\dot{\gamma}$, and the tone level P from from the complex envelope Z(t) as follows:

$$\hat{b} = \frac{1}{2\pi} Re\{\hat{\dot{\gamma}}(t_k)\} \tag{6}$$

$$\hat{f}_k = \frac{1}{2\pi} Im\{\hat{\dot{\gamma}}(t_k)\} \tag{7}$$

-continued $$\hat{P}_k = \tfrac{1}{2} | \hat{Z}(t_k) |^2 \qquad (8)$$

In FIG. 4, the signal transforming means consists of two multipliers 3 and 4, two reference signal sources 5 and 6, two low pass filters 7 and 8, two switches 9 and 10, controlled by a non-illustrated control circuit at a scanning frequency $f_T$, an analog-to-digital converter 11, and a calculator 12. The reference signal sources 5 and 6 generate reference signals $\cos \omega_o t$ and $\sin \omega_o t$, respectively, which are multiplied in the multipliers 3 and 4, respectively, with the tone frequency signal z(t).

The low pass filters postcoupled to the multipliers 3 and 4 eliminate the doppler frequency terms of the signals obtained at the output of the multipliers 3 and 4, and filter out high frequency interference signals, which may interfere with the time differentiations, and also determine the number of the independent estimates within the observation period D. At the output of the low pass filters 7 and 8, there are obtained signals α(t) and β(t), respectively, which correspond to the real portion Re, or the imaginary portion Im of the complex envelope Z(t)=α(t)+Jβ(t).

The signals α(t) and β(t) are fed to the analog-to-digital converter 11, through the switches 9 and 10, respectively via a (non-illustrated) control member, and are transformed there to digital signals. The calculator 12 computes the time-derivative $\dot{Z}(t)$ from the digital values of the signals α(t) and β(t) of the complex envelope Z(t), the value γ(t) according to equation (4), and computes the n independent estimated values $b_k$, $\Delta f_k$, and $P_k$, according to equations (6), (7), and (8).

FIG. 5 shows the basic block diagram of the calculator or computer 12. Two digital differentiating circuits 13 and 14 provide for the time differentiation $\dot{\alpha}(t)$ and $\dot{\beta}(t)$. In a circuit 15, the value γ(t) is derived from the values α(t) and β(t), and $\dot{\alpha}(t)$, $\dot{\beta}(t)$, according to the equation (4)

The required complex division is performed according to known rules, and is therefore not further discussed. The real portion of the value γ(t) yields the n estimated values $b_k$, and the imaginary portion, the n estimated values $\Delta f_k$. A calculator block 16 determines the n values $\hat{P}_k$ from the values α(t) and β(t) according to the relation $P=\alpha^2+\beta^2$ or $$\sqrt{P} = |\alpha| + |\beta|.$$

In lieu of the digital differentiating members 13 and 14, it is also possible to perform time differentiations to form the expressions $\dot{\alpha}(t)$ and $\dot{\beta}(t)$ by analog differentiating circuits, which in the circuit according to FIG. 4 are both coupled to the outputs of the low pass filters 7 and 8, respectively. The calculator or computer circuit 12 may be formed either by a dedicated logic circuit or, by a digital computer. It is preferable if the calculating block or circuit 12 and the necessary additional portions of the signal transforming means 1, as well as the classification means or device 2, are formed by a microcomputer.

The operating method of the classification device 2 will now be explained with the aid of the flow diagram of FIG. 6, for the case that the decision space $V_T$ is a parallelepiped type block, so that the estimated values for $\hat{P}_k$, $\hat{f}_k$, and $\hat{b}_k$ can be classified independently.

In the flow diagram, the letter Y denotes a "YES" and the letter N a "NO". Within the observation period D, in M passages, each of the n estimated tone points $\hat{T}_k$ is examined, whether the following conditions apply:

$$P_{S1} \leq \hat{P}_k \leq P_{S2}$$

$$-\Delta f_S \leq \Delta \hat{f}_k \leq \Delta f_S$$

$$-b_S \leq \hat{b}_k \leq b_S$$

so that the corresponding estimated value determined by the decision-space $V_T$ falls within the required class or not. Subsequently, it is determined whether the number $k_T$ of the estimated tone points $T_k$ falling in the decision space V, exceed the threshold value $k_{ST}$, in the affirmative case as signal "tone present" becomes available.

Figure 6:
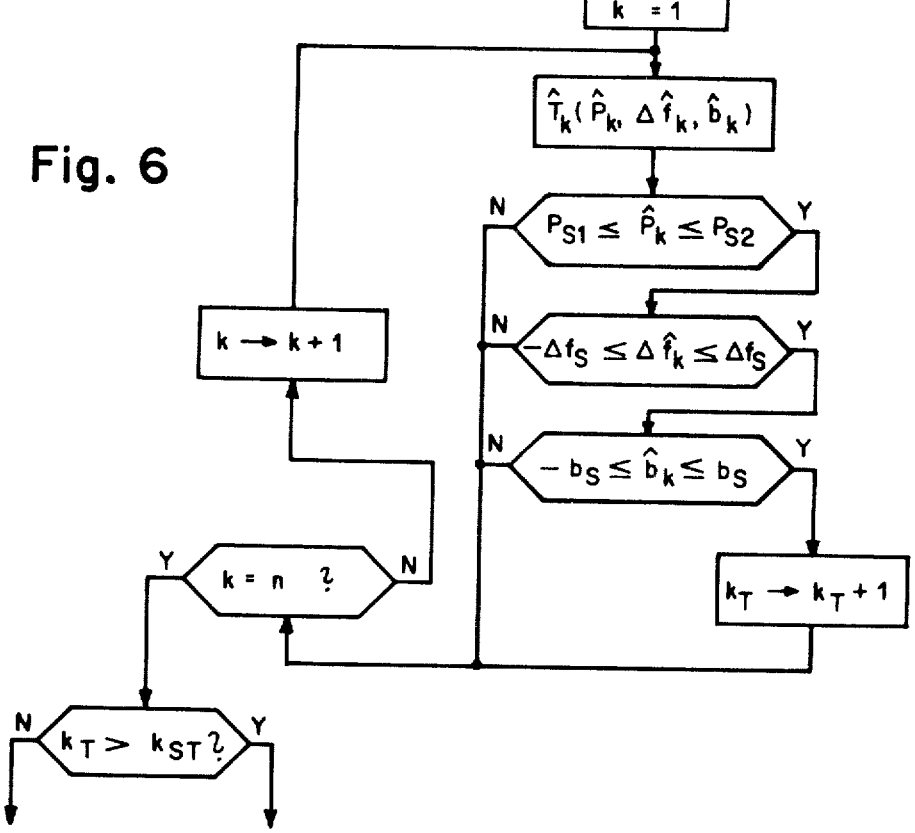
FIG. 6 is a flow diagram of a classification device.

It is also possible to examine by an analogous process not illustrated in FIG. 6, whether the number of $k_o$ estimated values within the decision space $V_o$ exceeds the threshold $k_{So}$, in which case a signal "tone absent" is generated. If neither a decision "tone present" nor a decision "tone absent" is obtained, then this can be regarded as an absence of a decision. By appropriately dimensioning the decision spaces $V_T$ and $V_O$, it is possible to optimize the ratio of "No decisions" to the error rate. In simple cases, it may be satisfactory to decide whether a tone is "present" or "absent", according to FIG. 6, solely by the decision space $V_T$.

The classification and counting of the decision values, and the subsequent decision based on the count, as illustrated in FIG. 6, can be accomplished by means of a microcomputer or by a dedicated logic.

Figure 7:
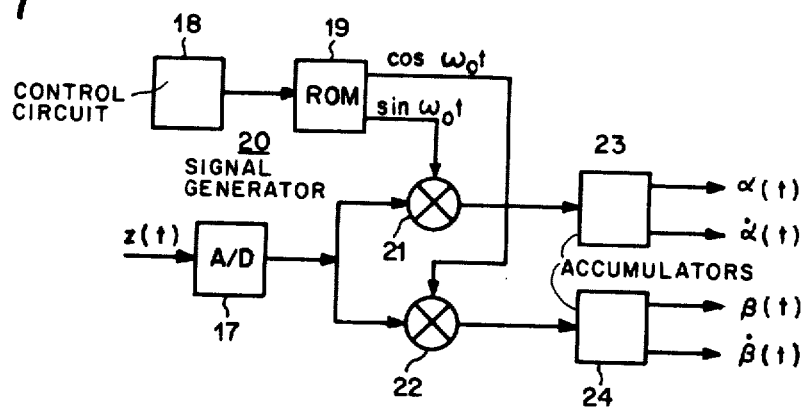
FIG. 7 is a circuit diagram of a digital implementation of a signal transforming device.

The analog formation of the values α(t) and β(t) were described by means of FIG. 4. FIG. 7 shows a block diagram for a digital formation of these values. The tone frequency signal z(t) is transformed in an analog-to-digital converter 17 continuously into an appropriate digital signal.

A signal generator 20, consisting of a control circuit 18, and a read-only-memory (ROM) 19, generates the reference signals $\cos \omega_o t$ and $\sin \omega_o t$ in digital form. Digital multipliers 21 and 22 form a product from the digitized tone frequency signal z(t), and from the reference signals $\cos \omega_o t$ or $\sin \omega_o t$. Digital accumulators 23 and 24 take the place of the low pass filters 7 and 8 in FIG. 4, as well as of the differentiating members 13 and 14 (FIG. 5), by integrating the output signals of the multipliers 21 and 22, on one hand, for formation of the values α(t) and β(t) during a predetermined time duration $T_1$ and on the other hand, for forming the values $\dot{\alpha}(t)$ and $\dot{\beta}(t)$ during a predetermined time period $T_2$, where $T_2 < T_1$.

The signal generator 20, multipliers 21 and 22, and the accumulators 23 and 24, may be portions of the same microcomputer, which microcomputer also forms the calculator circuit 12 (FIG. 4) and the classification device 2. The classification process does not require a high accuracy, so that the digital representation of the estimated values requires only short word lengths.

The word length may be further shortened by the use of known methods, so that the data processing may be accomplished in the limit by a word length of a single bit. In the latter case, the tone frequency signal z(t) may be transformed in a known fashion to a binary signal sequence (see, for example, IEEE Transactions on Communications, Vol. Com-24, No. 12, December, 1976, pp. 1291-1300) by adding a first auxiliary signal to the tone frequency signal by an adding circuit, by detecting by means of a comparison circuit the sign of the sum signal, and by scanning through a scanning circuit the binary sign ahead of the resulting expression at a relatively high frequency.

In a corresponding manner, it is also possible to derive binary reference signal sequences from the analog reference signals cos $\omega_o t$ and sin $\omega_o t$ by respectively adding a second auxiliary signal to the reference signals, detecting the sign of a so-obtained sum signal, and scanning the binary sign ahead of the expression. So-called "random" "pseudo-random" or "shift invariant independent" functions may be used as first and second auxiliary signals.

Instead of continuously computing the binary-reference signal sequences, they may be also stored in a ROM (read-only) memory. The multiplication of the binary signal sequence corresponding to the tone frequency signals with the binary reference signal sequence may be accomplished by an Exclusive OR gate, and the integration may be accomplished with the aid of a forward-backward counter.

Numerous applications exist for the tone detector described. It may be used in wireless or wire-dedicated remote control and remote measuring apparatus, in telephony and the like, wherever it is necessary to reliably detect an electrical tone frequency signal, even at high interference levels, particularly during impulse-like and interference disturbances. In network-controlled receivers, the tone detector described permits a trouble-free separation of the network control signals from network frequency harmonics and other interference values. In telephony, it is particularly suitable for use in so-called dial receivers employing multiple frequencies, where, in order to insure optimal security of the signaling process, the effective signal during dialing should not be suppressed by interference voltages, and where during a pause between dialing, any undesired imitation of the effective signal by noise should also be avoided.

Other advantageous applications in telephony are billing impulse counters, and systems for identification of the calling or used call-box by superimposed modulation of tone frequencies.

Figure 8:
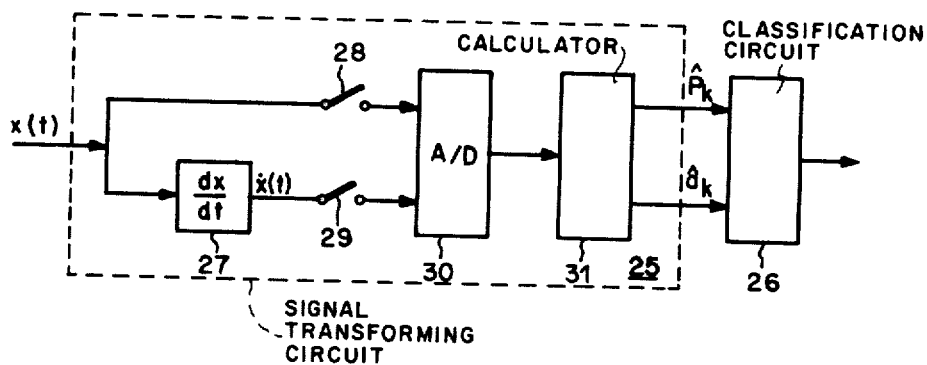
FIG. 8 is a circuit diagram of a direct current detector.

The DC detector, according to FIG. 8, includes a signal transforming circuit 25, and a classification circuit 26. The signal of each feature transforming circuit 25 includes a differentiator 27, two switches 28 and 29, controlled at the scanning frequency $f_T$ by a (non-illustrated) control circuit, an analog-to-digital converter 30, and a calculator 31.

The intput signal x(t) of the DC detector, and the time derivative of the input signal $\dot{x}(t)$ formed in the differentiating circuit 27, are fed via the switches 28 and 29 to the analog-to-digital converter 30, where they are transformed to corresponding digital signals.

In the calculator 31, the n estimated values $\hat{m}_k = [\hat{P}_k, \hat{a}_k]$ for the output level P and the bandwidth a are formed according to the relations:

$$P(t) = x^2(t) \text{ and}$$

$$a(t) = \frac{\dot{x}(t)}{x(t)}$$

Figure 9:
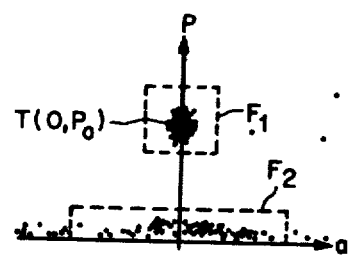
FIG. 9 is a diagram of estimated values.

In the classification circuit 26, the estimated values $\hat{P}$ and $\hat{a}_k$ are divided into at least two classes, which according to FIG. 9, may be formed by rectangular surfaces $F_1$ and $F_2$, or by surfaces of any arbitrary shape.

The estimated calues $\hat{T}_k(\hat{a}_k, \hat{P}_k)$ yield in FIG. 9 a point $T(O, P_o)$ on the P axis, if no interference signals are present, and if the measurement is free of any errors. In the case of an interference signal a grouping of the estimated values around the point T can still be recognized if the DC signal is present.

If a minimal number of estimated values T occur within the surface $F_1$ surrounding the point T, then at the output of the classification circuit 26, a "YES" signal is obtained.

It is, however, also possible to evaluate the value $\dot{x}(t)$ instead of the bandwidth a(t) as a characteristic feature, so that the calculator circuit 31 is simplified. The calculator 31 and the classification circuit 26 may again be formed by microcomputer. The differentiator 27 can also be located in the digital portion of the detector. Furthermore, the analog-to-digital converter 30 may be dispensed with, and the calculator 31 and the classification circuit 26 may be constructed from analog elements.

The DC current or DC voltage detector described is ideally suitable for receiving reports, for example, in alarm systems and other communication transmission systems, in which reports are transmitted by DC signals, and where DC signals must be reliably differentiated from interference signals.

The detectors described can be further developed so that they may be used to determine the presence or absence of at least two different electrical signals, having respective different characteristics. For this purpose, the estimated values are separated in the classification circuits 2 or 26 into different classes, associated respectively with the electrical signals to be differentiated. A "YES" signal is obtained for every electrical signal to be differentiated, if the number of estimated values, which is associated with a class corresponding to the respective signals, exceeds a predetermined threshold. For example, in a tone detector for telephony dialing, four different decision spaces $V_{T1}$ to $V_{T4}$ may be selected, which permits the detection of four different tone frequency signals, differing in frequency from one another. In a similar manner, for example, also DC signals of differing levels may be detected and differentiated from one another.

We wish it to be understood that we do not desire to be limited to the exact details of construction shown and described, for obvious modifications will occur to a person skilled in the art.

Having thus described the invention, what we claim as new and desire to be secured by Letters Patent, is as follows:

1. A detector for determining the presence of an electrical signal in the form of a tone in the presence of noise, said electrical signal having at least two predetermined characteristics, comprising in combination:

signal transforming means for obtaining a plurality of independent estimates of each of said characteristics, classification means connected to said signal transforming means for sorting said plurality of independent estimates into at least two classes, respectively, and counting means for signaling the presence of said electrical signal when the number of said estimates within one of said classes exceeds a predetermined number.

2. A detector for determining the presence of an electrical signal in the form of a tone in the presence of noise, said electrical signal having at least two predetermined characteristics,
comprising in combination:
signal transforming means for obtaining a plurality of independent estimates of each of said characteristics,
classification means connected to said signal transforming means for sorting said plurality of independent estimates into at least two classes, respectively, and
counting means for signaling the presence of said electrical signal when the number of said estimates within one of said classes exceeds a first predetermined number, and for signaling the absence of said electrical signal when the number of said estimates within the other of said classes exceeds a second predetermined number.

3. A detector as claimed in claim 1 or 2, wherein said electrical signal includes a tone signal, and said characteristics include the three characteristic features of output level, frequency, and power spectrum of said tone signal, and said classification means sorts said plurality of independent estimates of at least two of said three characteristic features into said at least two classes.

4. A detector as claimed in claim 1 or 2, wherein said electrical signal includes an input signal having a DC component, and wherein said predetermined characteristics include the three characteristic features of output level, bandwidth, and time derivative of said input signal, and wherein said signal transforming means obtains at least two of said three characteristic features of said predetermined characteristics.

5. A detector as claimed in claim 1 or 2, further comprising a microprocessor, said microprocessor forming at least a portion of said signal transforming means, and of said classification means.

6. A detector as claimed in claim 3, wherein said tone signal includes a tone frequency having a complex envelope $Z(t)$, and wherein $\dot{Z}(t)$ is the time derivative of said complex envelope, and wherein said signal transforming means obtains said frequency from the imaginary portion of the quotient of the time derivative of said complex envelope divided by said complex envelope $$\left[ Im \frac{\dot{Z}(t)}{Z(t)} \right].$$

and obtains said spectral density from the real portion of the quotient of the time derivative of said complex envelope divided by said complex envelope $$\left[ Re \frac{\dot{Z}(t)}{Z(t)} \right].$$

7. A detector as claimed in claim 6, wherein said signal transforming means includes a first multiplier means for forming a product of said frequency of said tone signal $z(t)$ and a first sinusoidal reference frequency, $(\cos \omega_o t)$ and a second multiplier means for forming a product of said frequency of said tone signal $z(t)$ and a second sinusoidal reference frequency $(\sin \omega_o t)$ shifted by 90° with respect to said first sinusoidal reference frequency, and further comprising means postcoupled to each of said multiplier means for de-emphasizing high frequencies in the output of each of said multiplier means, respectively.

8. A detector as claimed in claim 7, wherein the means postcoupled to each of said multiplier means include a low-pass frequency filter.

9. A detector as claimed in claim 7, wherein the means postcoupled to each of said multiplier means include an integrator.

10. A detector as claimed in claim 7, wherein said multiplier means are digital multiplier means, and further comprising digital signal generating means for generating said reference frequencies.

11. A detector as claimed in claim 1 or 2, for determining the presence of, and differentiating between at least two electrical signals having different respective characteristics, and wherein said classification means sorts said plurality of estimates into at least two classes corresponding to said different respective characteristics, and whereby, when the number of said estimates with a respective class exceeds a predetermined number, said detector signals the presence of the signal corresponding to said respective class.

12. A detector as claimed in claim 2, wherein said tone signal includes a tone frequency having a complex envelope $Z(t)$, and wherein $\dot{Z}(t)$ is the time derivative of said complex envelope, and wherein said signal transforming means obtains said frequency from the imaginary portion of the quotient of the time derivative of said complex envelope divided by said complex envelope $$\left\{ Im \frac{\dot{Z}(t)}{Z(t)} \right\}.$$

and obtains said power spectrum from the real portion of the quotient of the time derivative of said complex envelope divided by said complex envelope $$\left\{ Re \frac{\dot{Z}(t)}{Z(t)} \right\}.$$

13. A detector as claimed in claim 12, wherein said signal transforming means includes a first multiplier means for forming a product of said frequency of said tone signal $z(t)$ and a first sinusoidal reference frequency, $(\cos \omega_o t)$ and a second multiplier means for forming a product of said frequency of said tone signal $z(t)$ and a second sinusoidal reference frequency $(\sin \omega_o t)$ shifted by 90° with respect to said first sinusoidal reference frequency, and further comprising means postcoupled to each of said multiplier means for de-emphasizing high frequencies in the output of each of said multiplier means, respectively.

14. A detector as claimed in claim 13, wherein the means postcoupled to each of said multiplier means include a low-pass frequency filter.

15. A detector as claimed in claim 13, wherein the means postcoupled to each of said multiplier means include an integrator.

16. A detector as claimed in claim 13, wherein said multiplier means are digital multiplier means, and further comprising digital signal generating means for generating said reference frequencies.

* * * * *